United States Patent
Kim et al.

(10) Patent No.: US 8,576,635 B2
(45) Date of Patent: Nov. 5, 2013

(54) NONVOLATILE MEMORY DEVICE AND METHOD OF OPERATING THE SAME

(75) Inventors: Nam Kyeong Kim, Icheon-si (KR); Kyoung Chul Yang, Cheongju-si (KR); Young Jin Woo, Daejeon (KR); Tae Hyun Kim, Seongnam-si (KR)

(73) Assignee: SK hynix Inc., Icheon-Si (KR)

( * ) Notice: Subject to any disclaimer, the term of this patent is extended or adjusted under 35 U.S.C. 154(b) by 195 days.

(21) Appl. No.: 13/176,156

(22) Filed: Jul. 5, 2011

(65) Prior Publication Data
US 2012/0008395 A1    Jan. 12, 2012

(30) Foreign Application Priority Data
Jul. 9, 2010    (KR) .................. 10-2010-0066506

(51) Int. Cl.
*G11C 16/04*    (2006.01)

(52) U.S. Cl.
USPC ............ 365/185.29; 365/185.22; 365/185.27

(58) Field of Classification Search
USPC ............ 365/185.18, 185.22, 185.24, 185.27, 365/185.29, 185.3
See application file for complete search history.

(56) References Cited

U.S. PATENT DOCUMENTS

| | | | | |
|---|---|---|---|---|
| 5,343,434 A | * | 8/1994 | Noguchi | 365/185.04 |
| 5,491,657 A | * | 2/1996 | Haddad et al. | 365/185.27 |
| 8,018,774 B2 | * | 9/2011 | Hwang et al. | 365/185.22 |

FOREIGN PATENT DOCUMENTS

| | | |
|---|---|---|
| KR | 10-2002-0001251 A | 1/2002 |
| KR | 10-0781041 B1 | 11/2007 |

OTHER PUBLICATIONS

Office action for Korean patent application No. 10-2010-006506 dated Aug. 9, 2011.

* cited by examiner

*Primary Examiner* — Gene Auduong
(74) *Attorney, Agent, or Firm* — Marshall, Gerstein & Borun LLP

(57) ABSTRACT

A nonvolatile memory device includes memory cell blocks each configured to comprise memory cells erased by an erase voltage, supplied to a word line, and a bulk voltage supplied to a bulk, a bias voltage generator configured to generate a first erase voltage, having a first pulse width and a first amplitude, in order to perform the erase operation of the memory cells and a second erase voltage, having a second pulse width narrower than the first pulse width and a second amplitude lower than the first amplitude, in order to perform an additional erase operation if an unerased memory cell is detected after the erase operation is performed, and a bulk voltage generator configured to generate the bulk voltage.

5 Claims, 10 Drawing Sheets

GK1

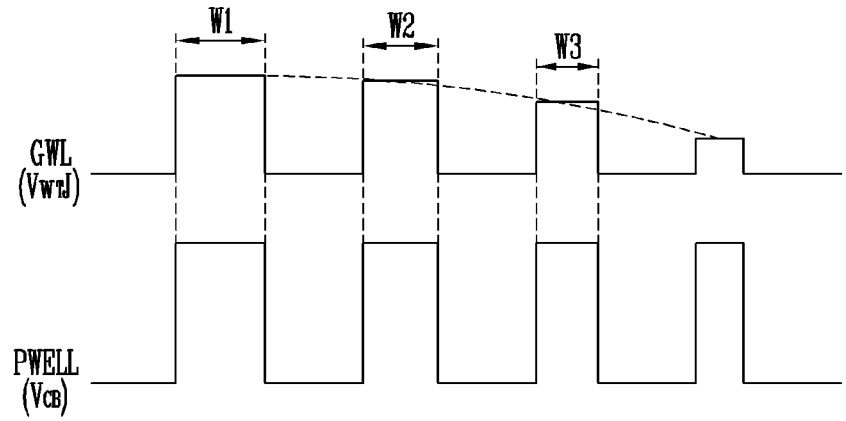
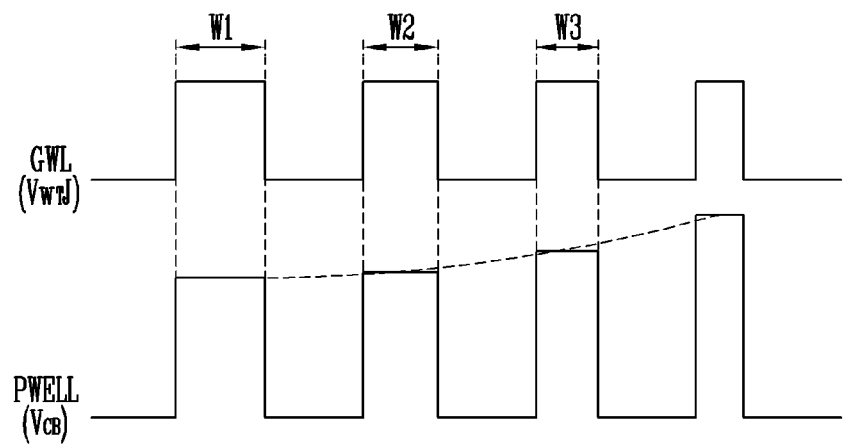
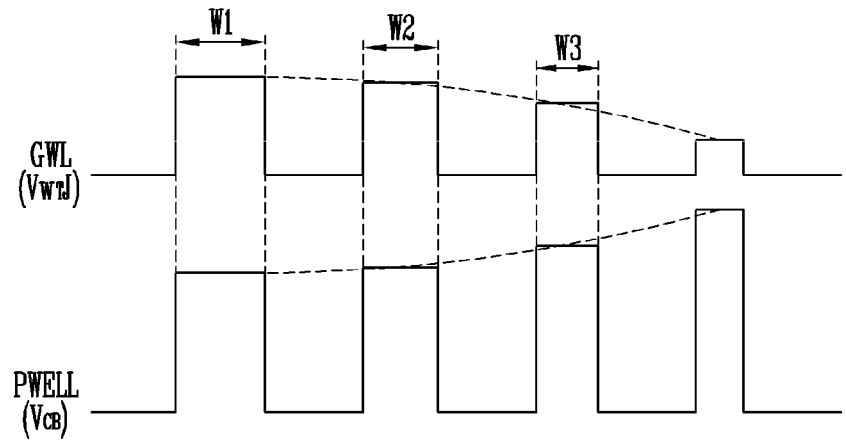

NONVOLATILE MEMORY DEVICE AND METHOD OF OPERATING THE SAME

CROSS-REFERENCE TO RELATED APPLICATION

Priority to Korean patent application number 10-2010-0066506 filed on Jul. 9, 2010, the entire disclosure of which is incorporated by reference herein, is claimed.

BACKGROUND

Exemplary embodiments relate to a nonvolatile memory device and a method of operating the same and, more particularly, to a nonvolatile memory device and a method of operating the same, which can be applied to an erase operation of a memory cell.

A flash memory device is a representative nonvolatile memory device and is divided into a NOR type and a NAND type. The NOR type flash memory device is chiefly used to store a small amount of information at high speed. The NAND type flash memory device is chiefly used to store a large amount of information. Furthermore, the flash memory device performs a read operation for data output, a program operation for data input, and an erase operation for data erasure. In particular, the program operation and the erase operation of the NAND type flash memory device are executed by means of Fowler-Nordheim (FN) tunneling of electrons which are generated in a tunnel insulating layer between the P-well well and the floating gate of a memory cell. That is, electrons are injected from the P-well to the floating gate of the memory cell via the tunnel insulating layer by means of FN tunneling, so that the program operation of the flash memory device is performed. In this program operation, electrons are injected into only the floating gates of selected ones of a plurality of memory cells included in a memory cell block. Furthermore, electrons within the floating gate of the memory cell are discharged toward the P-well by means of FN tunneling, so that the erase operation of the flash memory device is performed. In this erase operation, data stored in all the memory cells included in a selected one of a plurality of memory cell blocks is erased at the same time. That is, the erase operation is performed per memory cell block.

FIG. 1 is a circuit diagram of memory cells and pass gates for illustrating the erase operation of a known flash memory device.

Referring to FIG. 1, during the erase operation, a bias voltage Vb of 0 V is supplied to a global word line GWL, and a bulk voltage VBK1 of 20 V is supplied to the P-wells of memory cells CA1 to CAn and CB1 to CBn (n is an integer). The sources and drains of the memory cells CA1 to CAn and CB1 to CBn become a floating state. Furthermore, a block selection signal BKSEL1 of a voltage (Vcc) level is inputted to the gate of an NMOS transistor NM1 coupled between the local word line WL1 and the global word line GWL of a selected (that is, to be erased) memory cell block A. Furthermore, a bulk voltage VBK2 of 0 V is supplied to the substrate (not shown) of the NMOS transistor NM1. The NMOS transistor NM1 is turned on in response to the block selection signal BKSEL1 and configured to couple the local word line WL1 to the global word line GWL. Consequently, the voltage of the local word line WL1 becomes 0 V, and a voltage difference of 20 V is generated between each of the control gates (not shown) of the memory cells CA1 to CAn, coupled to the local word line WL1, and each of the P-wells of the memory cells CA1 to CAn. Accordingly, the electrons of the floating gates of the memory cells CA1 to CAn are discharged toward the P-wells, so that the erase operation of the memory cell block A is performed.

Meanwhile, a block selection signal BKSEL2 of 0 V is supplied to the gate of an NMOS transistor NM2 coupled between the local word line WL2 and the global word line GWL of an unselected (that is, not to be erased) memory cell block B. Furthermore, a bulk voltage VBK2 of 0 V is supplied to the substrate of the NMOS transistor NM2. The NMOS transistor NM2 is turned off in response to the block selection signal BKSEL2 and configured to separate the local word line WL2 from the global word line GWL. Consequently, the local word line WL2 becomes a floating state. Next, the bulk voltage VBK1 of 20 V supplied to the P-wells of the memory cells CB1 to CBn is drained out to the local word line WL2 owing to a capacitive coupling phenomenon, so that the voltage level of the local word line WL2 is boosted up to about 19 V. Accordingly, a fine voltage difference of about 1 V is generated between the local word line WL2 and the P-wells of the memory cells CB1 to CBn, and thus electrons are not discharged from the floating gates of the memory cells CB1 to CBn. Consequently, during the time for which the erase operation of the memory cell block A is performed, the erase operation of the memory cell block B is not performed.

Meanwhile, with an increase in the number of erase/program cycles, a fast program phenomenon in which a threshold voltage exceeds a target voltage during the program operation or a slow erase phenomenon in which a threshold voltage is not sufficiently lowered below a target voltage during the erase operation is generated. This phenomenon is described in more detail below with reference to FIG. 2.

FIG. 2 is a characteristic graph illustrating a slow erase characteristic and a fast program characteristic according to the number of erase operations in a known art.

Referring to FIG. 2, although a program or erase operation is performed under the same conditions, a threshold voltage gradually becomes higher than a target voltage with an increase in the number of erase cycles after the program or erase operation. This phenomenon becomes worse because the amount of electrons trapped in a tunnel insulating layer between the floating gate of a memory cell and a semiconductor substrate is increased with an increase in the number of program/erase cycles. This means that the program operation is quickly performed or the erase operation is slowly performed.

Meanwhile, in order to discharge electrons accumulated in the floating gate toward the substrate during the erase operation, a high voltage has to be supplied to the substrate. With an increase in the voltage difference between the word line and the bulk of the substrate, the fast program and slow erase phenomena become worse.

FIG. 3 is a characteristic graph illustrating a slow erase characteristic and a fast program characteristic according to the levels of an erase voltage in a known art.

From FIG. 3, it can be seen that if an erase operation is performed in a state in which the voltage difference between the word line and the bulk is high (that is, in a high potential erase state), the fast program phenomenon and the slow erase phenomenon become worse. It can also be seen that if an erase operation is performed in the state in which the voltage difference between the word line and the bulk is relatively low (that is, in a low potential erase state), the fast program phenomenon and the slow erase phenomenon are minimized.

In order to prevent the fast program phenomenon and the slow erase phenomenon, the erase operation has to be performed in a state in which the voltage difference between the word line and the bulk is reduced. In this case, however, the time that it takes to perform the erase operation time is lengthened, and the erase operation may not be normally performed. After the erase operation, an erase verification operation is performed. In the case where the erase operation is not normally performed, a corresponding block is treated as an invalid block and is not used. In this case, there are problems in that the number of available blocks is reduced and the data storage capacity is reduced.

BRIEF SUMMARY

According to exemplary embodiments of this disclosure, an increment of the operation time can be minimized and the generation of a fast program phenomenon and a slow erase phenomenon can be prevented by controlling the level of voltage supplied to a global word line and a substrate (or a bulk or P-well) during the erase operation of a selected memory block.

A nonvolatile memory device according to an aspect of this disclosure includes memory cell blocks each configured to include memory cells erased by an erase voltage, supplied to a word line, and a bulk voltage supplied to a bulk; a bias voltage generator configured to generate a first erase voltage, having a first pulse width and a first amplitude, in order to perform the erase operation of the memory cells and a second erase voltage, having a second pulse width narrower than the first pulse width and a second amplitude lower than the first amplitude, in order to perform an additional erase operation if an unerased memory cell is detected after the erase operation is performed; and a bulk voltage generator configured to generate the bulk voltage.

The bias voltage generator may be configured to lower the level of the second erase voltage whenever the additional erase operation is performed. The bias voltage generator may be configured to lower the level of the second erase voltage by a certain value whenever the additional erase operation is performed. The bias voltage generator may be configured to increase a decrement of the second erase voltage whenever the additional erase operation is performed. The bias voltage generator may be configured to decrease a decrement of the second erase voltage whenever the additional erase operation is performed.

A nonvolatile memory device according to another aspect of this disclosure includes memory cell blocks each configured to include memory cells erased by an erase voltage, supplied to a word line, and a bulk voltage supplied to a bulk; a bias voltage generator configured to supply the erase voltage to the word line in order to perform an erase operation of the memory cells; and a bulk voltage generator configured to supply a bulk voltage to a bulk in order to perform the erase operation and another bulk voltage, having a narrowed pulse width and a raised potential, to the bulk in order to perform an additional erase operation if an unerased memory cell is detected after the erase operation.

The bulk voltage generator may be configured to raise the level of the bulk voltage by a certain value whenever the additional erase operation is performed. The bulk voltage generator may be configured to increase an increment of the bulk voltage whenever the additional erase operation is performed. The bulk voltage generator may be configured to decrease an increment of the bulk voltage whenever the additional erase operation is performed.

The bulk voltage generator may be configured to narrow the pulse width of the bulk voltage whenever the additional erase operation is performed.

A method of operating a nonvolatile memory device according to another aspect of this disclosure includes performing an erase operation by supplying an erase voltage of a positive potential to the word lines of a selected memory block and supplying a bulk voltage to the bulk of memory cells coupled to the word lines, performing an erase verification operation for detecting an unerased memory cell from among the memory cells, and performing an additional erase operation by increasing the difference between the erase voltage and the bulk voltage and reducing the time taken for the erase voltage to be supplied to the word lines or the time taken for the bulk voltage to be supplied to the bulk, if the unerased memory cell is detected.

The level of the erase voltage may be lowered in order to increase the difference between the erase voltage and the bulk voltage whenever the additional erase operation may be performed. The level of the erase voltage may be lowered by a certain value in order to increase the difference between the erase voltage and the bulk voltage whenever the additional erase operation may be performed. A decrement of the erase voltage may be increased in order to increase the difference between the erase voltage and the bulk voltage whenever the additional erase operation is performed. A decrement of the erase voltage may be decreased in order to increase the difference between the erase voltage and the bulk voltage whenever the additional erase operation is performed.

The level of the bulk voltage may be raised in order to increase the difference between the erase voltage and the bulk voltage whenever the additional erase operation is performed. The level of the bulk voltage may be raised by a certain value in order to increase the difference between the erase voltage and the bulk voltage whenever the additional erase operation is performed. An increment of the bulk voltage may be increased in order to increase the difference between the erase voltage and the bulk voltage whenever the additional erase operation is performed. An increment of the bulk voltage may be decreased in order to increase the difference between the erase voltage and the bulk voltage whenever the additional erase operation is performed. The level of the erase voltage may be lowered and the level of the bulk voltage may be raised in order to increase the difference between the erase voltage and the bulk voltage whenever the additional erase operation is performed.

The level of the erase voltage may be lowered by a certain value and the level of the bulk voltage may be raised by a certain value, in order to increase the difference between the erase voltage and the bulk voltage whenever the additional erase operation is performed. A decrement of the erase voltage may be increased and an increment of the bulk voltage may be increased, in order to increase the difference between the erase voltage and the bulk voltage whenever the additional erase operation is performed. A decrement of the erase voltage may be decreased and an increment of the bulk voltage may be decreased, in order to increase the difference between the erase voltage and the bulk voltage whenever the additional erase operation is performed.

Whenever the additional erase operation is performed, the pulse widths of the erase voltage and the bulk voltage may be narrowed in order to reduce the time taken for the erase voltage to be supplied to the word lines and the time taken for the bulk voltage to be supplied to the bulk.

BRIEF DESCRIPTION OF THE DRAWINGS

FIGS. 10A to 10C are waveforms illustrating a second exemplary embodiment in which voltage is supplied to the global word line and the P-well during the erase operation in FIG. 5;

DESCRIPTION OF EMBODIMENTS

Hereinafter, some exemplary embodiments of this disclosure will be described in detail with reference to the accompanying drawings. The figures are provided to allow those having ordinary skill in the art to understand the scope of the embodiments of the disclosure.

Figure 4:
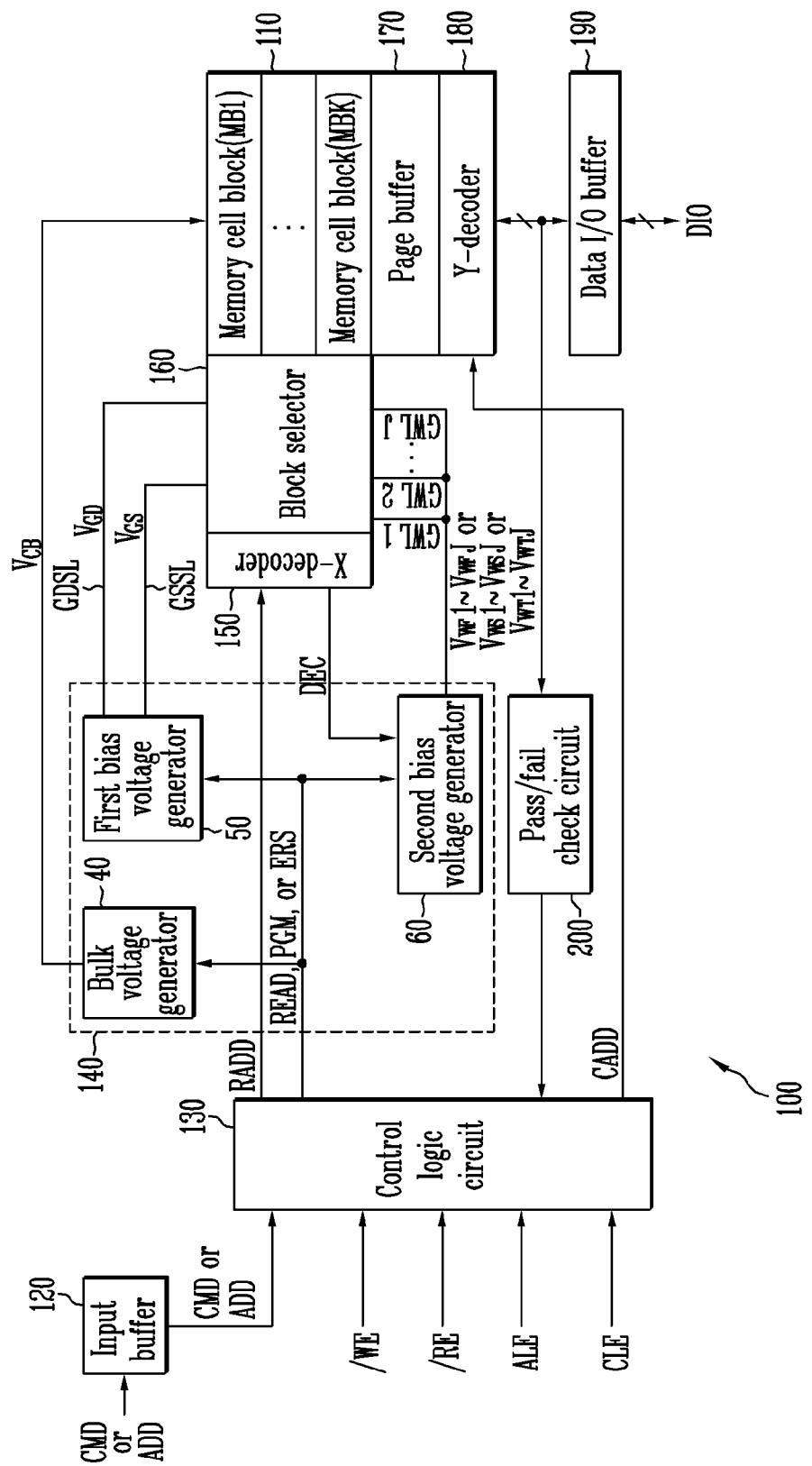
FIG. 4 is a block diagram of a flash memory device according to an exemplary embodiment of this disclosure.

FIG. 4 is a block diagram of a flash memory device according to an exemplary embodiment of this disclosure.

Referring to FIG. 4, the flash memory device 100 includes a memory cell array 110, an input buffer 120, a control logic circuit 130, a high voltage generator 140, an X-decoder 150, a block selector 160, a page buffer 170, a Y-decoder 180, a data I/O buffer 190, and a pass/fail check circuit 200.

The memory cell array 110 includes memory cell blocks MB1 to MBK (K is a positive integer), each including a plurality of memory cells (not shown). The input buffer 120 receives a command signal CMD or an address signal ADD and outputs it to the control logic circuit 130. The control logic circuit 130 receives the command signal CMD or the address signal ADD in response to external control signals /WE, /RE, ALE, and CLE. The control logic circuit 130 generates one of a read command READ, a program command PGM, and an erase command ERS in response to the command signal CMD. Furthermore, in response to the address signal ADD, the control logic circuit 130 generates a row address signal RADD and a column address signal CADD.

The high voltage generator 140 includes a bulk voltage generator 40, a first bias voltage generator 50, and a second bias voltage generator 60. The bulk voltage generator 40 generates a bulk voltage VCB in response to one of the read command READ, the program command PGM, and the erase command ERS and supplies the bulk voltage VCB to the bulk (for example, a P-well) of memory cells. More particularly, the bulk voltage generator 40 generates the bulk voltage VCB of a low voltage (for example, 0 V) level in response to the read command READ or the program command PGM. Furthermore, the bulk voltage generator 40 generates the bulk voltage VCB of a high voltage (for example, 16 V to 20 V) level in response to the erase command ERS. Meanwhile, if, after an erase verification operation, the pass/fail check circuit 200 detects data outputted from the Y-decoder 180 and a memory cell on which an erase operation has not been normally performed is determined to exist as a result of the detection, the control logic circuit 130 controls the bulk voltage generator 140 so that the bulk voltage generator 140 controls the level of the bulk voltage VCB. For example, if an erase operation has not been normally performed, the level of the bulk voltage VCB may be raised in unit of 0.5 V or 1 V, and the increment may be changed according to the design.

The first bias voltage generator 50 generates a drain bias voltage VGD and a source bias voltage VGS in response to one of the read command READ, the program command PGM, and the erase command ERS, supplies the drain bias voltage VGD to a global drain selection line GDSL, and supplies the source bias voltage VGS to a global source selection line GSSL. More particularly, the first bias voltage generator 50 generates the drain bias voltage VGD and the source bias voltage VGS of a high voltage (for example, 4.5 V) level in response to the read command READ. The first bias voltage generator 50 generates the drain bias voltage VGD of an internal voltage (VCC, not shown) level and the source bias voltage VGS of a low voltage level in response to the program command PGM. Furthermore, the first bias voltage generator 50 generates the drain bias voltage VGD and the source bias voltage VGS of a low voltage level in response to the erase command ERS.

The second bias voltage generator 60 generates word line bias voltages VWF1 to VWFJ (J is a positive integer), word line bias voltages VWS1 to VWSJ (J is a positive integer), or word line bias voltages VWT1 to VWTJ (J is a positive integer) in response to a decoding signal DEC and one of the read command READ, the program command PGM, and the erase command ERS and supplies them to global word lines GWL1 to GWLJ (J is a positive integer). More particularly, the second bias voltage generator 60 generates the word line bias voltages VWF1 to VWFJ in response to the read command READ. The second bias voltage generator 60 generates the word line bias voltages VWS1 to VWSJ in response to the program command PGM. Furthermore, the second bias voltage generator 60 generates the word line bias voltages VWT1 to VWTJ in response to the erase command ERS. Here, the second bias voltage generator 60 generates a positive voltage higher than 0 V in response to the erase command ERS. After an erase verification operation is performed, the pass/fail check circuit 200 detects data outputted from the Y-decoder 180. If, as a result of the detection, there is a memory cell on which an erase operation has not been normally performed, the control logic circuit 130 controls the second bias voltage generator 60 so that the levels of the word line bias voltages VWT1 to VWTJ are controlled. For example, if an erase operation has not been normally performed, the levels of the word line bias voltages VWT1 to VWTJ are lowered in unit of 0.1 V to 0.5 V, and the decrement may be changed according to the design.

If an erase operation has not been normally performed, the bulk voltage generator 40 and the second bias voltage generator 60 control the levels of the output voltages. This is for the purpose of performing the erase operation again by increasing the voltage difference between the word line and the bulk. In this case, only one of the bulk voltage generator 40 and the second bias voltage generator 60 can control the levels of the output voltages so that the voltage difference between the word line and the bulk can be increased. Alternatively, both the bulk voltage generator 40 and the second bias voltage generator 60 may control the levels of the output voltages. This is described in detail later.

The X-decoder 150 generates the decoding signal DEC by decoding the row address signal RADD. The block selector 160 selects one or some of the memory cell blocks MB1 to MBK in response to the decoding signal DEC and couples the local word lines (refer to WL11 to WL1J of FIG. 5) of a selected memory cell block (or selected memory cell blocks) and the respective global word lines GWL1 to GWLJ. Furthermore, the block selector 160 couples the drain selection line (refer to one of DSL1 to DSLK of FIG. 5) of the selected memory cell block and the global drain selection line GDSL and couples the source selection line (refer to one of SSL1 to SSLK of FIG. 5) of the selected memory cell block and a global source selection line GSSL. The configurations and operations of the page buffer 170, the Y-decoder 180, and the data I/O buffer 190 will be understood by those having ordinary skill in the art to which this disclosure pertains, and a detailed description thereof is omitted.

Figure 5:
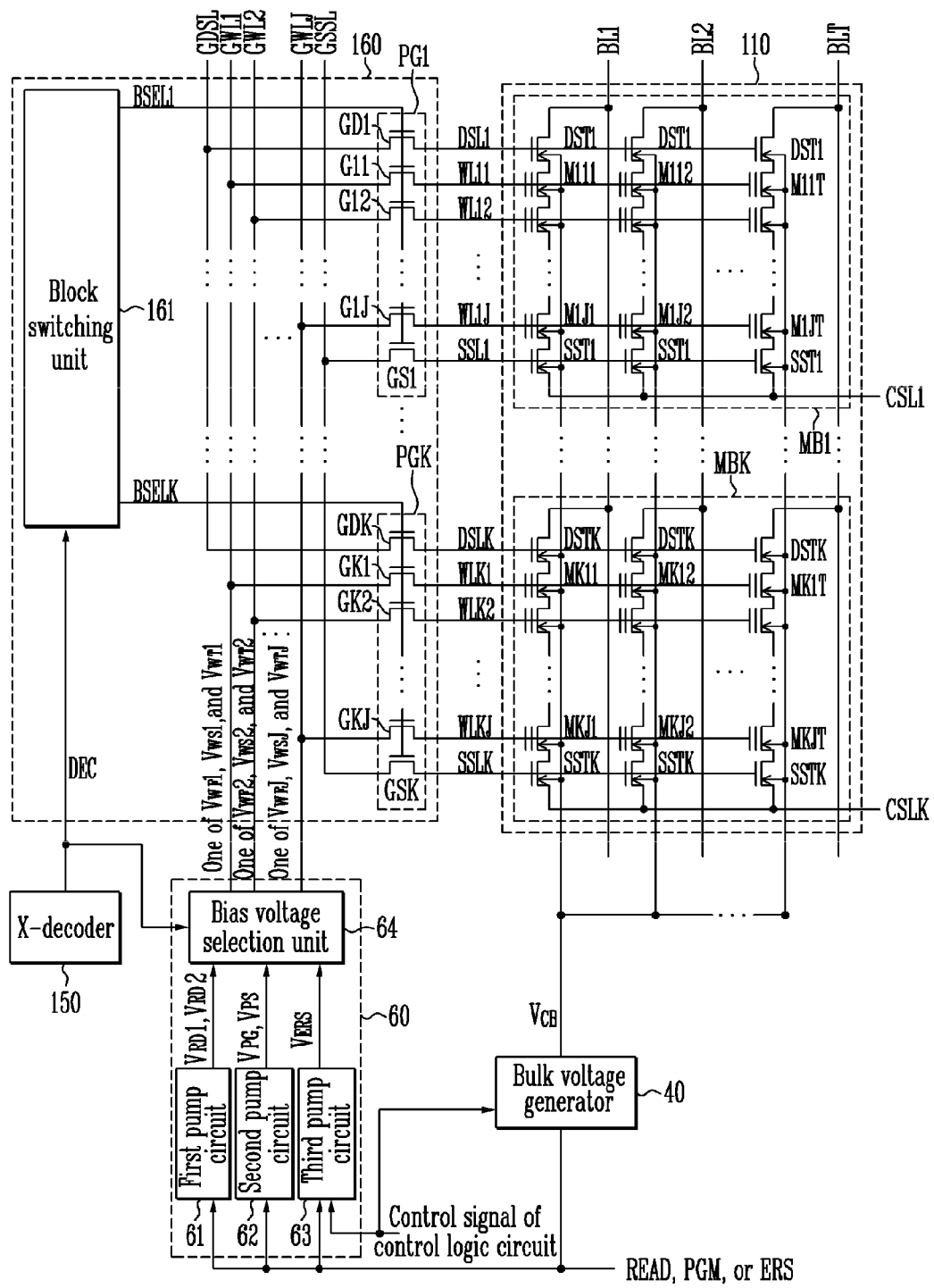
FIG. 5 is a detailed diagram of a memory cell array, a block selector, a second bias voltage generator, a bulk voltage generator, and an X-decoder shown in FIG. 4.

FIG. 5 is a detailed diagram of the memory cell array, the block selector, the second bias voltage generator, the bulk voltage generator, and the X-decoder shown in FIG. 4.

Referring to FIG. 5, the memory cell block MB1 of the memory cell array 110 includes memory cells M111 to M1JT (J and T are positive integers), drain selection transistors DST1, and source selection transistors SST1. The memory cells M111 to M1JT share bit lines BL1 to BLT (T is a positive integer), local word lines WL11 to WL1J (J is a positive integer), and a common source line CSL1. That is, the memory cells M111 to M11T are coupled to the respective bit lines BL1 to BLT through the drain selection transistors DST1, and the memory cells M1J1 to M1JT are coupled to the common source line CSL1 through the respective source selection transistors SST1. Furthermore, the gates of the memory cells M111 to M1JT are coupled to the local word lines WL11 to WL1J. Meanwhile, the gates of the drain selection transistors DST1 are coupled to a local drain selection line DSL1. The gates of the source selection transistors SST1 are coupled to the local source selection line SSL1.

Each of the memory cell blocks MB2 to MBK of the memory cell array 110 has a similar configuration to the memory cell block MB1, and a detailed description thereof is omitted. The block selector 160 includes a block switching unit 161 and a plurality of switching units PG1 to PGK (K is a positive integer). The block switching unit 161 generates block selection signals BSEL1 to BSELK (K is a positive integer) in response to the decoding signal DEC received from the X-decoder 150. The plurality of switching units PG1 to PGK is disposed to correspond to the respective memory cell blocks MB1 to MBK and is enabled or disabled in response to the respective block selection signals BSEL1 to BSELK.

Each of the plurality of switching units PG1 to PGK includes a plurality of switching elements. For example, the switching unit PG1 includes switching elements GD1, G11 to G1J, and GS1. Each of the switching units PG2 to PGK has a similar configuration and operation to the switching unit PG1, and thus only the switching unit PG1 is chiefly described. Preferably, the switching elements GD1, G11 to G1J, and GS1 may be implemented using NMOS transistors. Hereinafter, the switching elements GD1, G11 to G1J, and GS1 are referred to as NMOS transistors. The block selection signal BSEL1 is inputted to the gates of the NMOS transistors GD1, G11 to G1J, and GS1. The source of the NMOS transistor GD1 is coupled to the global drain selection line GDSL, and the drain thereof is coupled to the local drain selection line DSL1. The sources of the NMOS transistors G11 to G1J are coupled to the respective global word lines GWL1 to GWLJ, and the drains thereof are coupled to the respective local word lines WL11 to WL1J. The source of the NMOS transistor GS1 is coupled to the global source selection line GSSL, and the drain thereof is coupled to the local source selection line SSL1. The NMOS transistors GD1, G11 to G1J, and GS1 are turned on or off at the same time in response to the block selection signal BSEL1. More particularly, when the block selection signal BSEL1 is enabled, the NMOS transistors GD1, G11 to G1J, and GS1 are turned on. When the block selection signal BSEL1 is disabled, the NMOS transistors GD1, G11 to G1J, and GS1 are turned off. When the NMOS transistors GD1, G11 to G1J, and GS1 are turned on, the global drain selection line GDSL is coupled to the local drain selection line DSL1, the global source selection line GSSL is coupled to the local source selection line SSL1, and the global word lines GWL1 to GWLJ are coupled to the respective local word lines WL11 to WL1J.

The second bias voltage generator 60 includes first to third pump circuits 61 to 63 and a bias voltage selection unit 64. The pump circuit 61 generates read voltages VRD1 and VRD2 in response to the read command READ. Preferably, the read voltage VRD1 has a high voltage (for example, 4.5 V) level, and the read voltage VRD2 has a low voltage (for example, 0 V) level. During the read operation of the memory cell array 110, the read voltage VRD1 is supplied to a local word line coupled to the gates of unselected memory cells (that is, memory cells not to be read), and the read voltage VRD2 is supplied to a local word line coupled to the gates of selected memory cells (that is, memory cells to be read).

The second pump circuit 62 generates program voltages VPG, VPS in response to the program command PGM. Preferably, the program voltages VPG, VPS have respective high voltage levels (for example, VPG=18 V and VPS=10 V). During the program operation of the memory cell array 110, the program voltage VPG is supplied to a local word line coupled to the gates of memory cells to be programmed, and the program (or pass) voltage VPS is supplied to a local word line coupled to the gates of memory cells not to be programmed.

Furthermore, the third pump circuit 63 generates an erase voltage VERS of a positive level higher than 0 V in response to the erase command ERS. That is, during the erase operation, the third pump circuit 63 generates the erase voltage VERS so that voltage of a level higher than 0 V is supplied to the word lines of a selected memory block. At this time, in a memory block on which the erase operation is performed, the voltage difference between the word line and the bulk is lowered by the erase voltage VERS of a positive potential. The erase voltage VERS is preferably generated with a level to such an extent that the voltage difference between the word line and the bulk becomes 15 V to 20 V in the block on which the erase operation is performed.

Meanwhile, in the operation of the pass/fail check circuit 200 determining whether the erase operation has been normally performed, if data of a non-erase state (for example, 0) is detected (that is, the erase operation failed) from among the data outputted from the Y-decoder (refer to 180 of FIG. 4), the third pump circuit 63 lowers the level of the erase voltage VERS in unit of 0.1 V to 0.5 V in response to the control signal of the control logic circuit 130. In this case, the decrement may be changed according to the design. For example, a decrement of the erase voltage VERS may be fixed to a specific value. In some embodiments, whenever the erase operation is repeatedly performed, a decrement of the erase voltage VERS may be gradually increased or decreased. That is, the erase voltage VERS may be lowered in a primary or quadratic function way or may be lowered in an exponential function way. Accordingly, the voltage difference between the word line and the bulk is increased, and the erase operation is performed again according to the increased voltage difference.

The bias voltage selection unit 64 selects the read voltages VRD1 and VRD2 and supplies them to the global word lines GWL1 to GWLJ as the respective word line bias voltages VWF1 to VWFJ, selects the program voltages VPG, VPS and supplies them to the global word lines GWL1 to GWLJ as the respective word line bias voltages VWS1 to VWSJ (J is a positive integer), or selects the erase voltage VERS and supplies it to the global word lines GWL1 to GWLJ as the respective word line bias voltages VWT1 to VWTJ, in response to the decoding signal DEC of the X-decoder 150.

The bulk voltage generator 40 generates the bulk voltage VCB of a high voltage to be supplied to a bulk (for example, a P-well) in which the memory cells M111 to M1JT (J and T are positive integers) are formed during an erase operation, in response to the erase command ERS. In this case, the bulk voltage VCB is generated with a level to such an extent that the voltage difference between the word line and the bulk becomes 15 V to 20 V in a block on which the erase operation is performed.

Meanwhile, in the operation of the pass/fail check circuit 200 determining whether the erase operation has been normally performed, if data of a non-erase state (for example, 0) is detected (that is, the erase operation failed) from among the data outputted from the Y-decoder (refer to 180 of FIG. 4), the bulk voltage generator 40 raises the level of the bulk voltage VCB in unit of 0.5 V to 1 V in response to the control signal of the control logic circuit 130. In this case, the increment may be changed according to the design. For example, an increment of the bulk voltage VCB may be fixed to a specific value. In some embodiments, whenever the erase operation is repeatedly performed, an increment of the bulk voltage VCB may be gradually increased or decreased. That is, the bulk voltage VCB may be raised in a primary or quadratic function way or may be raised in an exponential function way. Accordingly, the voltage difference between the word line and the bulk is increased, and the erase operation is performed again according to the increased voltage difference.

If the erase operation is not normally performed after the erase operation is performed in the state in which a positive voltage is supplied to the global word line as described above, the erase operation is performed again by controlling the output voltage of any one of or both the third pump circuit 63 and the bulk voltage generator 40 so that the voltage difference between the word line and the bulk is increased. Here, the output voltage of the third pump circuit 63 or the bulk voltage generator 40 preferably is controlled so that the voltage difference between the word line and the bulk is 15 V or higher.

Figure 6:
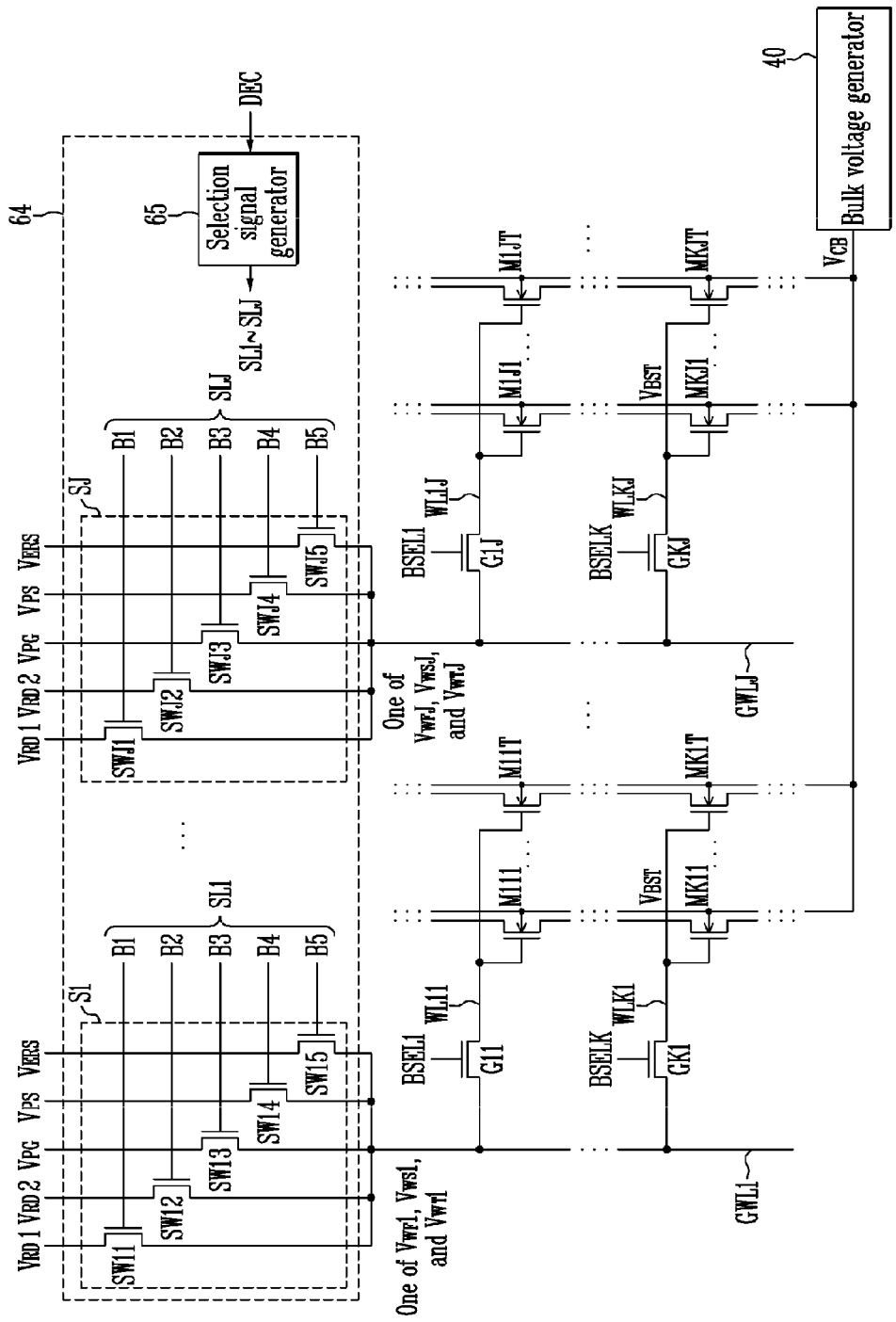
FIG. 6 is a detailed diagram of memory cells, switching elements, the bulk voltage generator, and the bias voltage selection unit shown in FIG. 5.

FIG. 6 is a detailed diagram of the memory cells, the switching elements, the bulk voltage generator, and the bias voltage selection unit shown in FIG. 5.

Referring to FIG. 6, the bias voltage selection unit 64 includes a selection signal generator 65 and selection circuits S1 to SJ (J is a positive integer). The selection signal generator 65 generates selection signals SL1 to SLJ on the basis of the decoding signal DEC. The selection circuits S1 to SJ includes switches SW11 to SW15, . . . , SWJ1 to SWJ5 coupled to the respective global word lines GWL1 to GWLJ. Each of the selection circuits S1 to SJ receives the read voltages VRD1 and VRD2, the program voltages VPG and VPS, and the erase voltage VERS. The selection circuits S1 to SJ output the respective word line bias voltages VWF1 to VWFJ, VWS1 to VWSJ, or VWT1 to VWTJ to the global word lines GWL1 to GWLJ in response to the respective selection signals SL1 to SLJ. More particularly, for example, the switches SW11 to SW15 of the selection circuit S1 are coupled between the global word line GWL1 and the read voltages VRD1 and VRD2, the program voltages VPG and VPS, and the erase voltage VERS. The switches SW11 to SW15 are turned on or off according to the respective logic values of bits B1 to B5 of the selection signal SL1. In the case where the switches SW11 to SW15 are formed of NMOS transistors, when the logic values of the bits B1 to B5 are 1, the switches SW to SW15 are turned on. Furthermore, when the logic values of the bits B1 to B5 are 0, the switches SW11 to SW15 are turned off.

For example, when one of the switches SW11 or SW12 is turned on, one of the read voltages VRD1 or VRD2 is supplied to the global word line GWL1 as the word line bias voltage VWF1. When one of the switches SW13 or SW14 is turned on, one of the program voltages VPG, VPS is supplied to the global word line GWL1 as the word line bias voltage VWS1. Furthermore, when the switch SW15 is turned on, the erase voltage VERS is inputted to the global word line GWL1 as the word line bias voltage VWT1. At this time, since the selection signal generator 65 generates the logic value of one of the bits B1 to B5 as 1 and the logic values of the remaining bits as 0, one of the switches SW11 to SW15 is turned on and the remaining switches are turned off. Consequently, one of the read voltages VRD1 or VRD2, the program voltages VPG or VPS, and the erase voltage VERS is supplied to the global word line GWL1. Each of the selection circuits S2 to SJ has a similar configuration and operation to the selection circuit S1, and a detailed description thereof is omitted.

In FIG. 6, each of the selection circuits S1 to SJ is illustrated to include the five switches SW11 to SW15. However, in the case where the selection circuits S1 to SJ output the respective word line bias voltages VWF1 to VWFJ, VWS1 to VWSJ, or VWT1 to VWTJ, the configurations of the selection circuits S1 to SJ may be modified in various ways.

In FIG. 6, only the NMOS transistors G11, GK1, G1J, and GKJ, the local word lines WL11, WL1J, WLK1, and WLKJ, and the memory cells M111, M11T, M1J1, M1JT, MK11, MK1T, MKJ1, and MKJT coupled to the global word lines GWL1, GWLJ are illustrated, for the simplification of the figure. The gates of the memory cells M111 to M11T are coupled to the local word line WL11, and the gates of the memory cells M1J1 to M1JT are coupled to the local word line WL1J. Furthermore, the gates of the memory cells MK11 to MK1T are coupled to the local word line WLK1, and the gates of the memory cells MKJ1 to MKJT are coupled to the local word line WLKJ. The source and drain of the NMOS transistor G11 are coupled to the global word line GWL1 and the local word line WL11, respectively. The source and drain of the NMOS transistor GK1 are coupled to the global word line GWL1 and the local word line WLK1, respectively. Furthermore, the source and drain of the NMOS transistor G1J are coupled to the global word line GWLJ and the local word line WL1J, respectively, and the source and drain of the NMOS transistor GKJ are coupled to the global word line GWLJ and the local word line WLKJ, respectively.

Figure 7:
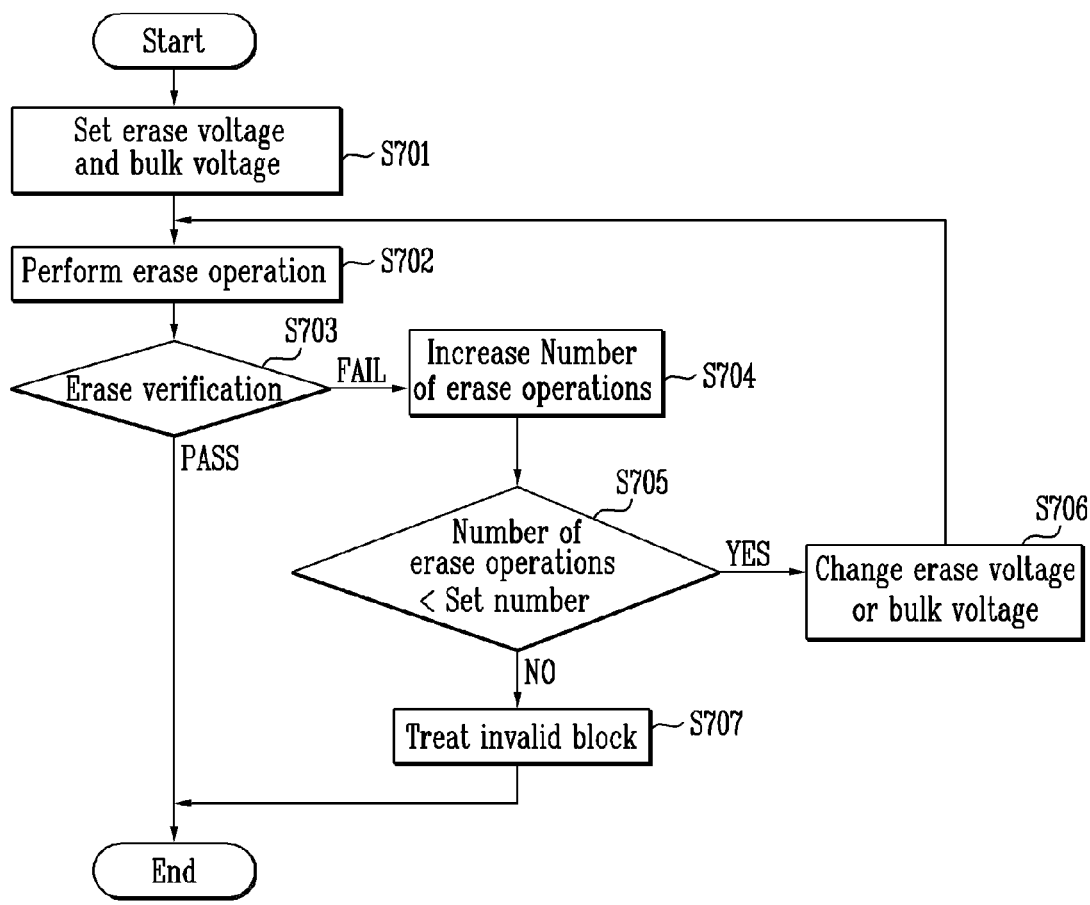
FIG. 7 is a flowchart illustrating a method of controlling an erase operation of the flash memory device according to an exemplary embodiment of this disclosure.

FIG. 7 is a flowchart illustrating a method of controlling the erase operation of the flash memory device according to an exemplary embodiment of this disclosure.

Referring to FIGS. 5 and 7, the levels of the erase voltage VWTJ and the bulk voltage VCB are set so that the erase voltage VWTJ has a positive potential and a difference between the erase voltage VWTJ and the bulk voltage VCB becomes 15 V at block S701. After the levels of the erase voltage VWTJ and the bulk voltage VCB are set, an erase operation is performed on all the flash memory cells of a memory block, selected in response to the block selection signal BLKWL, using the erase voltage VWTJ and the bulk voltage VCB at block S702. After the erase operation is finished, it is verified whether the erase operation has been normally performed at block S703. If, as a result of the verification, the erase operation has been normally performed on all the flash memory cells (that is, PASS), the erase operation is terminated. However, if, as a result of the verification, there is a flash memory cell on which the erase operation has not been normally performed (that is, FAIL), the levels of the erase voltage VWTJ and the bulk voltage VCB are set again and the erase operation is performed again. This is described in more detail below.

First, the number of erase operations is increased at block S704. It is then determined whether the number of erase operations is smaller than a set number at block S705. If, as a result of the determination, the number of erase operations is determined to be smaller than the set number, the level of the erase voltage VWTJ or the bulk voltage VCB is changed at block S706. Here, the levels of the erase voltage VWTJ and the bulk voltage VCB are changed so that the difference between the erase voltage VWTJ and the bulk voltage VCB gradually becomes greater than 15 V. A method of changing the levels of the erase voltage VWTJ and the bulk voltage VCB is described later. After the levels of the erase voltage VWTJ and the bulk voltage VCB are changed, the erase operation is performed again using the changed voltages at block S702. After the erase operation is performed, the steps S703 to S705 are performed again.

Meanwhile, if the erase operation is not normally performed until the number of erase operation becomes the set number, the corresponding block is treated as an invalid block at block S707.

The erase operation of the flash memory device 100 described with reference to FIG. 7 is described in more detail with reference to FIGS. 4 to 6. First, the control logic circuit 130 generates the erase command ERS in response to the external control signals /WE, /RE, ALE, and CLE and the command signal CMD and generates the row address signal RADD in response to the address signal ADD. In response to the erase command ERS, the bulk voltage generator 40 of the high voltage generator 140 generates the bulk voltage VCB of a high voltage (for example, 17 V) level and supplies it to the bulk (or P-well) in which the memory cell blocks MB1 to MBK are formed. Furthermore, in response to the erase command ERS, the first bias voltage generator 50 of the high voltage generator 140 generates the drain bias voltage VGD and the source bias voltage VGS of a low voltage (for example, 0 V) level. Accordingly, the drain bias voltage VGD is supplied to the global drain selection line GDSL, and the source bias voltage VGS is supplied to the global source selection line GSSL.

Meanwhile, the X-decoder 150 decodes the row address signal RADD and generates the decoding signal DEC. The second bias voltage generator 60 of the high voltage generator 140 generates the word line bias voltages VWT1 to VWTJ in response to the erase command ERS and the decoding signal DEC and supplies them to the respective global word lines GWL1 to GWLJ. More particularly, the third pump circuit 63 of the second bias voltage generator 60 generates the erase voltage VERS having a positive value in response to the erase command ERS. For example, the erase voltage VERS may have a value which is lower than the bulk voltage VCB, supplied to the P-well of memory cells during the erase operation, and is positive. Preferably, during the erase operation, the difference between the erase voltage VERS and the bulk voltage VCB supplied to the P-well of the memory cells may be set to be greater than or equal to 15 V. In response to the decoding signal DEC, the bias voltage selection unit 64 of the second bias voltage generator 60 selects the erase voltage VERS and outputs it as the word line bias voltages VWT1 to VWTJ. More particularly, the selection signal generator 65 of the bias voltage selection unit 64 outputs all the values of the bits B1 to B5 of the selection signals SL1 to SLJ as '00001' in response to the decoding signal DEC. The switches SW15 to SWJ5 of the selection circuits S1 to SJ of the bias voltage selection unit 64 are turned on and all the switches SW11 to SWJ1, SW12 to SWJ2, SW13 to SWJ3, and SW14 to SWJ4 thereof are turned off, in response to the respective selection signals SL1 to SLJ. Accordingly, the erase voltage VERS is supplied to the global word lines GWL1 to GWLJ through the switches SW15 to SWJ5 as the word line bias voltages VWT1 to VWTJ.

Furthermore, the block selector 160 selects one of the memory cell blocks MB1 to MBK in response to the decoding signal DEC and couples the local word lines of the selected memory cell block to the respective global word lines GWL1 to GWLJ. For example, if the memory cell block MB1 is selected, the block switching unit 161 of the block selector 160 enables the block selection signal BSEL1 and disables all the block selection signals BSEL2 to BSELK in response to the decoding signal DEC. Consequently, only the switching unit PG1 of the block selector 160 is enabled, and all the switching units PG2 to PGK are disabled. More particularly, the switching elements GD1, G11 to G1J, and GS1 of the switching unit PG1 are turned on at the same time, and all the switching elements GD2 to GDK, G21 to G2J, . . . , GK1 to GKJ, and GS2 to GSK of the switching units PG2 to PGK are turned off. Accordingly, the drain selection line DSL1 of the memory cell block MB1 is coupled to the global drain selection line GDSL, and the source selection line SSL1 thereof is coupled to the global source selection line GSSL. Consequently, the drain bias voltage VGD and the source bias voltage VGS of a low voltage level are supplied to the drain selection line DSL1 and the source selection line SSL1, respectively, and thus the drain selection transistor DST1 and the source selection transistor SST1 are turned off. Accordingly, the drains and sources of the memory cells M111 to M1JT of the memory cell block MB1 become a floating state.

Furthermore, the local word lines WL11 to WL1J of the memory cell block MB1 are coupled to the respective global word lines GWL1 to GWLJ. Consequently, the word line bias voltages VWT1 to VWTJ of the global word lines GWL1 to GWLJ are transferred to the respective local word lines WL11 to WL1J. Accordingly, a voltage difference (for example, 15 V or higher) is generated between the bulk and each of the gates of the memory cells M111 to M1JT of the memory cell block MB1, and electrons are discharged from the floating gates of the memory cells M111 to M1JT by means of the voltage difference. Consequently, the erase operation of the memory cells M111 to M1JT is performed.

Figure 8A:
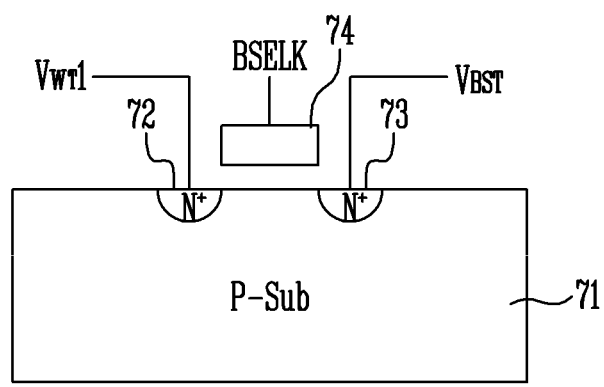
FIG. 8A is a diagram showing an example of the switching element shown in FIG. 6.
Figure 8B:
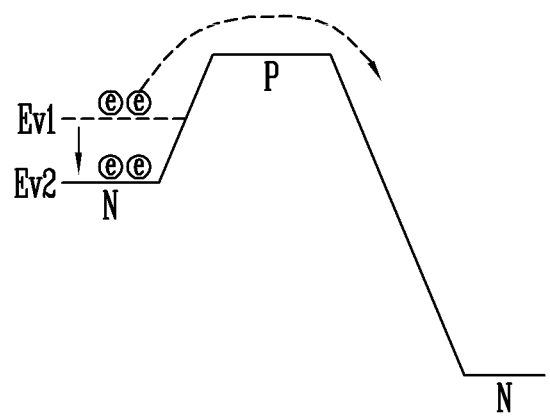
FIG. 8B is a diagram showing a change in the energy potential according to a change in the bias voltage of a word line in the switching element of FIG. 6.

Meanwhile, the drain selection lines DSL2 to DSLJ of the memory cell blocks MB2 to MBK are separated from the global drain selection line GDSL, and the source selection lines SSL2 to SSLJ thereof are also separated from the global source selection line GSSL. Furthermore, all the local word lines WL2J to WL2J, ..., WLK1 to WLKJ of the memory cell blocks MB2 to MBK are separated from the global word lines GWL1 to GWLJ. Accordingly, the local word lines WL21 to WL2J, ..., WLK1 to WLKJ are boosted by the bulk voltage VCB of a high voltage (for example, 20 V) level, supplied to the memory cells of the memory cell blocks MB2 to MBK. Consequently, a boosting voltage VBST close to the bulk voltage VCB is generated in the local word lines WL21 to WL2J, ..., WLK1 to WLKJ. In this case, the operations of the NMOS transistors G21 to G2J, ..., GK1 to GKJ coupled between the global word lines GWL1 to GWLJ and the local word lines WL21 to WL2J, ..., WLK1 to WLKJ of the memory cell blocks MB2 to MBK are described in more detail with reference to FIGS. 8A and 8B. FIGS. 8A and 8B show a cross-sectional view and energy potential of the NMOS transistor GK1. Each of the operations of the NMOS transistors G21 to G2J, ..., GK2 to GKJ is similar to that of the NMOS transistor GK1, and a detailed description thereof is omitted.

FIG. 8A shows the cross-sectional view of the NMOS transistor GK1 which is a switching element coupled to the local word line WLK1 of the memory cell block MBK. The word line bias voltage VWT1 having a positive value is supplied to the source 72 of the NMOS transistor GK1, and the block selection signal BSELK of a low (for example, 0 V) level is supplied to the gate 74 of the NMOS transistor GK1. Furthermore, the boosting voltage VBST is supplied to the drain 73 of the NMOS transistor GK1. Since the block selection signal BSELK is in a low level, the NMOS transistor GK1 is turned off. Furthermore, since the word line bias voltage VWT1 has a positive value, the energy potential of the source (72) region is decreased to Ev2, as shown in FIG. 8B. Accordingly, the amount of electrons flowing from the source 72 to a substrate 71 is reduced, and thus the amount of electrons flowing into the local word line WLK1 coupled to the drain 73 is reduced. Since the leakage current generated in the NMOS transistor GK is reduced, the local word line WLK1 maintains the level of the boosting voltage VBST. Consequently, data of the memory cells coupled to the local word line WLK1 is not erased.

Unlike the above, if the word line bias voltage VWT1 of 0 V is supplied to the source 72, the energy potential of the source (72) region is increased to Ev1, as shown in FIG. 8B. Accordingly, the amount of electrons flowing from the source 72 to the substrate 71 is increased, and thus the amount of the leakage current generated in the NMOS transistor GK1 is increased. In order to reduce the leakage current of the NMOS transistor GK1, the energy potential of the source (72) region needs to be reduced.

After an erase operation is performed under the above conditions, whether all the memory cells of a block on which the erase operation has been performed have been normally erased is determined. This may be determined based on data outputted through the Y-decoder 180 from the page buffer 170. For example, after a read operation is performed for every string in the state in which 0 V is supplied all the word lines, if data outputted through the Y-decoder 180 is '1', the erase operation may be determined to have been normally performed. If the data is '0', it may be determined that there is a memory cell on which the erase operation has not been normally performed. In a known art, if a fail cell exists as in the latter case, a corresponding block is treated as an invalid block and is not used, thereby reducing the data storage capacity. In this disclosure, however, an erase operation is performed again by increasing the voltage difference between the word line and the bulk, thereby being capable of minimizing the generation of an invalid block. The process of performing the erase operation by controlling the voltage difference is described in more detail below.

Figure 9A:
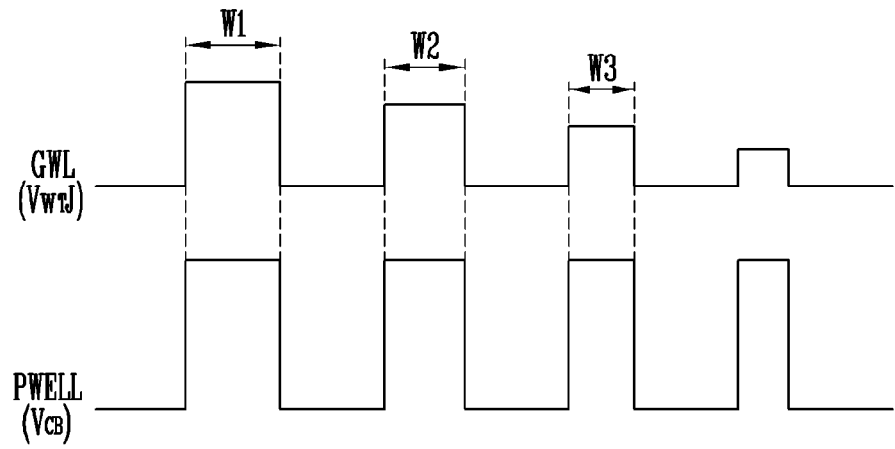
FIGS. 9A to 9C are waveforms illustrating a first exemplary embodiment in which voltage is supplied to a global word line and a P-well during the erase operation in FIG. 5.
Figure 9B:
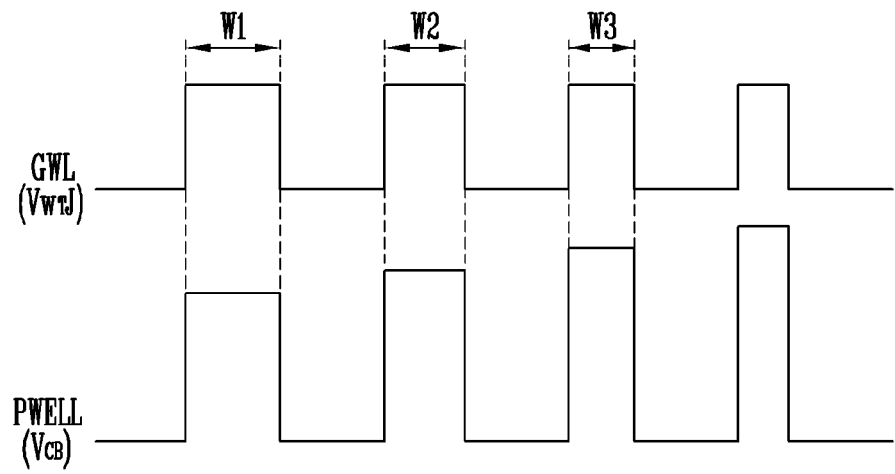
Figure 9C:
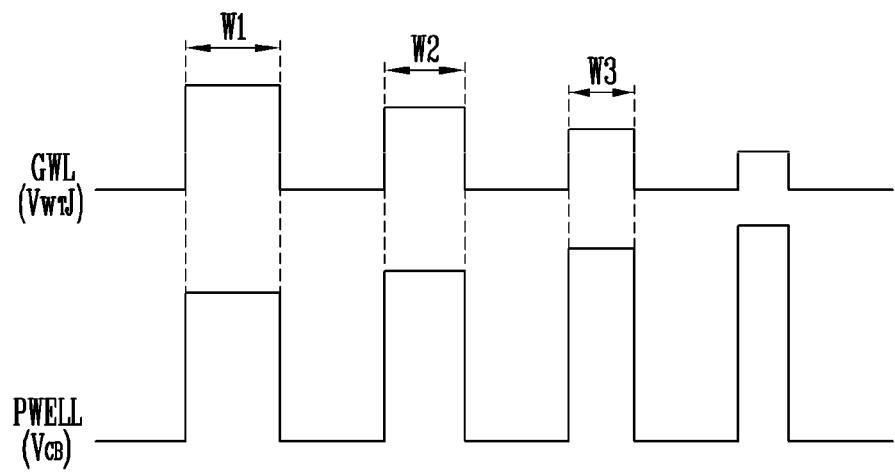

FIGS. 9A to 9C are waveforms illustrating a first exemplary embodiment in which voltage is supplied to the global word line and the P-well during the erase operation in FIG. 5. FIGS. 10A to 10C are waveforms illustrating a second exemplary embodiment in which voltage is supplied to the global word line and the P-well during the erase operation in FIG. 5.

Referring to FIG. 9A, the erase voltage VWTJ of a specific level, having a positive value, is supplied to the global word line GWL. The bulk voltage VCB, which is 15 V or higher than the erase voltage VWTJ, is supplied to the bulk PWELL. In this state, an erase operation is performed. In a first erase operation, the erase voltage VWTJ and the bulk voltage VCB are supplied in the form of a pulse having a first pulse width W1. After the first erase operation is completed, the pass/fail check circuit 200 detects data outputted through the Y-decoder 180 in an erase verification operation and determines whether there is a memory cell on which the first erase operation has not been normally performed based on the detected data.

If, as a result of the determination, there is a memory cell on which the first erase operation has not been normally performed, the second bias voltage generator 60 lowers the level of the erase voltage VWTJ and supplies it to the global word line GWL. Here, the erase voltage VWTJ has a second pulse width W2 narrower than the first pulse width W1 of the erase voltage VWTJ supplied in the first erase operation. Consequently, the voltage difference between the global word line GWL and the bulk PWELL is increased. In the state in which the voltage difference has been increased, a second erase operation is performed again.

It is then determined whether there is a memory cell on which the second erase operation has not been normally performed. If, as a result of the determination, there is a memory cell on which the second erase operation has not been normally performed, the second bias voltage generator 60 lowers the level of the erase voltage VWTJ in unit of 0.1 V to 0.5 V in order to increase the voltage difference and supplies the lowered erase voltage VWTJ to the global word line GWL. Here, the erase voltage VWTJ may have a third pulse width W3 narrower than the second pulse width W2 of the erase voltage VWTJ supplied in the first erase operation.

The above erase method is called an Incremental Stepping Pulse Erase (ISPE) method. The erase operation is performed again by increasing the voltage difference according to the ISPE method. If all the memory cells are normally erased in the process of performing the erase operation again, the erase operation is stopped. However, if there is a fail memory cell even after the erase operation is performed a certain number of times, a corresponding block is treated as an invalid block. The number of erase operations performed again may be changed according to the design. For example, the number of erase operations performed again may be determined to such an extent that the erase operations are completed within a target time.

Meanwhile, when an erase operation is performed again, if the erase voltage VWTJ and the bulk voltage VCB, having a voltage difference greater than a voltage difference between the erase voltage VWTJ and the bulk voltage VCB supplied in a previous erase operation and also having a narrower pulse width than that of the previous erase operation, are supplied as described above, the voltage difference between the local word line and the bulk (that is, P-well) to which the erase voltage VWTJ is supplied from the global word line is increased, but the time that it takes to supply the erase voltage VWTJ and the bulk voltage VCB is decreased. That is, the time for which the high voltage difference is maintained between the local word line and the bulk is reduced. Consequently, the generation of a fast program phenomenon or a slow erase phenomenon can be prohibited by the high voltage difference between the local word line and the bulk.

In the above method, when the erase operation is performed again, the voltage difference between the word line and the bulk is increased by lowering the level of the erase voltage VWTJ supplied to the global word line GWL. However, as shown in FIG. 9B, the bulk voltage generator 40 may raise the level of the bulk voltage VCB in unit of 0.5 V to 1 V so as to increase the voltage difference between the word line and the bulk. In some embodiments, as shown in FIG. 9C, the second bias voltage generator 60 may lower the erase voltage VWTJ and, at the same time, the bulk voltage generator 40 may raise the bulk voltage VCB so that the voltage difference between the word line and the bulk is increased. In this case, when an erase operation is performed again, if the erase voltage VWTJ and the bulk voltage VCB, having a voltage difference greater than a voltage difference between the erase voltage VWTJ and the bulk voltage VCB supplied in a previous erase operation and also having a narrower pulse width than that of the previous erase operation, are supplied as described above, the time for which the high voltage difference is maintained is reduced, thereby being capable of prohibiting the generation of a fast program phenomenon or a slow erase phenomenon.

In the above methods, the difference between the erase voltage VWTJ and the bulk voltage VCB (that is, the voltage difference between the local word line and the bulk) is regularly increased. However, the difference between the erase voltage VWTJ and the bulk voltage VCB (that is, the voltage difference between the local word line and the bulk) may be controlled as shown in FIGS. 10A to 10C. For example, whenever the erase operation is performed, a decrement of the erase voltage VWTJ may be increased as shown in FIG. 10A. In some embodiments, whenever the erase operation is performed, an increment of the bulk voltage VCB may be increased as shown in FIG. 10B. In some embodiments, whenever the erase operation is performed, a decrement of the erase voltage VWTJ and an increment of the bulk voltage VCB may be increased as shown in FIG. 10C.

According to the present disclosure, the generation of an invalid block can be minimized, and a reduction in the threshold voltage due to a slow erase phenomenon in an unselected block on which an erase operation has not been normally performed or the generation of a fast program or slow erase phenomenon due to repeated erase operations can be prohibited.

Figure 11:
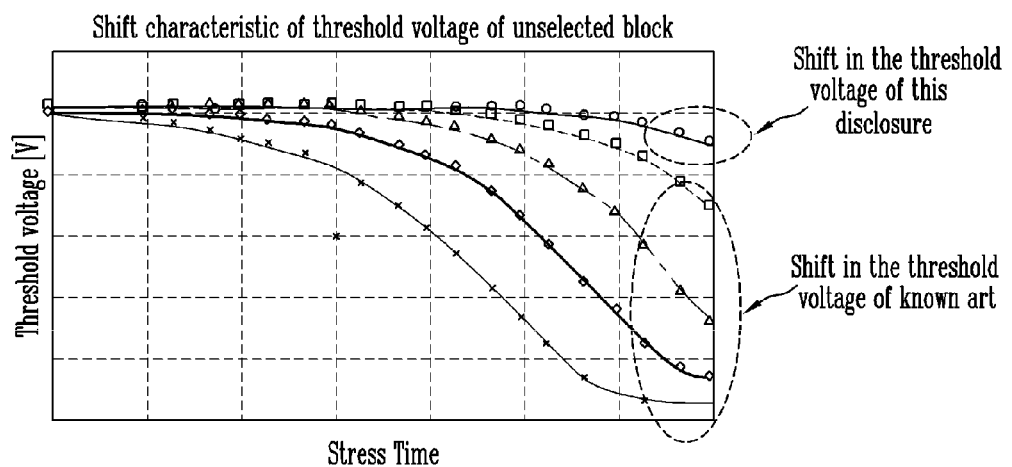
FIG. 11 is a characteristic graph illustrating a shift in the threshold voltage of an unselected block during the erase operation.

FIG. 11 is a characteristic graph illustrating a shift in the threshold voltage of an unselected block during the erase operation.

Referring to FIG. 11, in a known art, the leakage current is generated in a switching element (for example, G1J (J is a positive integer) of FIG. 5). For this reason, a slow erase phenomenon in which voltage flowing into a word line is gradually lowered and an erase operation is performed in order to prohibit the erase operation in an unselected block is generated. Consequently, there is a problem in that the threshold voltage of a memory cell in the unselected block is lowered. In the present disclosure, however, in order to prevent the generation of the leakage current in a switching element (for example, G1J of FIG. 5 (J is a positive integer)), an erase operation is performed in the state in which the erase voltage of a positive potential has been supplied to the global word line. Accordingly, a slow erase phenomenon is rarely generated in an unselected block. Consequently, a shift in the threshold voltage can be minimized.

Figure 12:
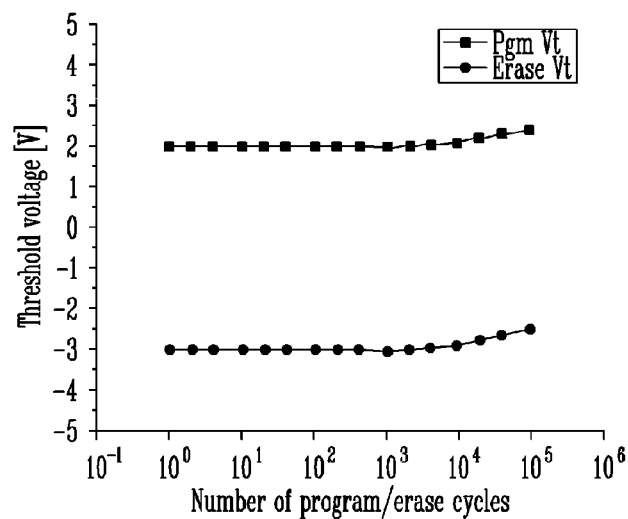
FIG. 12 is a characteristic graph illustrating a slow erase characteristic and a fast program characteristic according to the number of erase operations according to this disclosure.

FIG. 12 is a characteristic graph illustrating a slow erase characteristic and a fast program characteristic according to the number of erase operations according to this disclosure.

Figure 1:
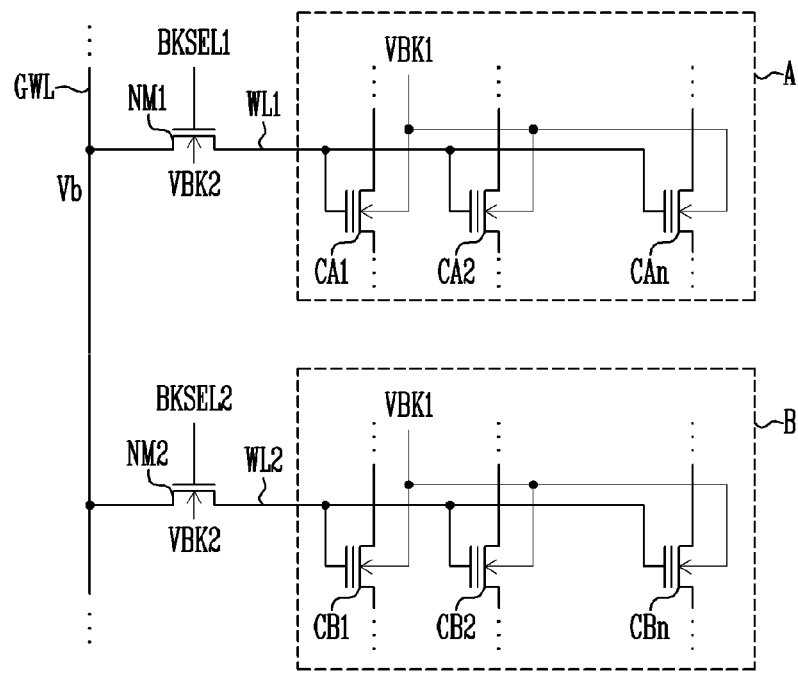
FIG. 1 is a circuit diagram of memory cells and pass gates for illustrating the erase operation of a known flash memory device.
Figure 2:
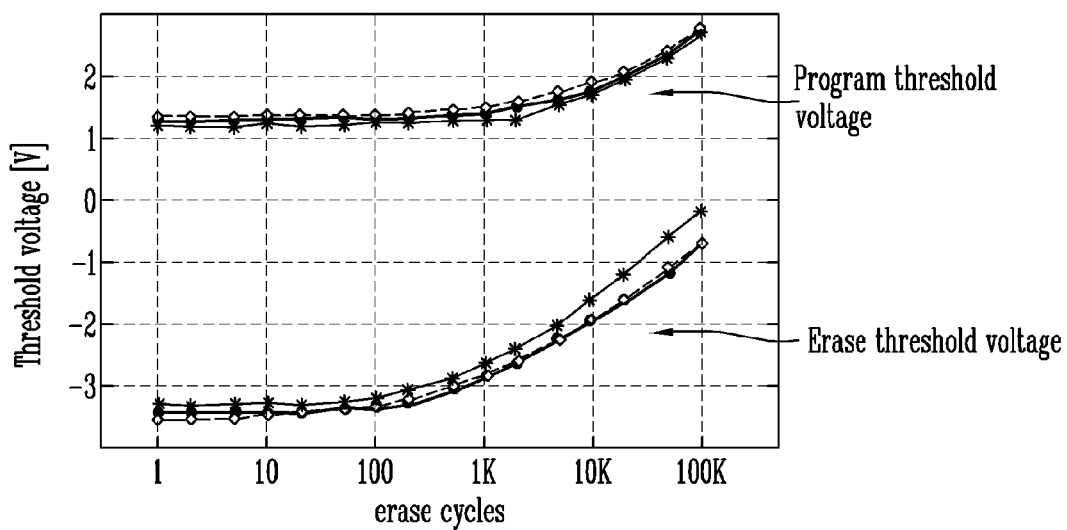
FIG. 2 is a characteristic graph illustrating a slow erase characteristic and a fast program characteristic according to the number of erase operations in a known art.
Figure 3:
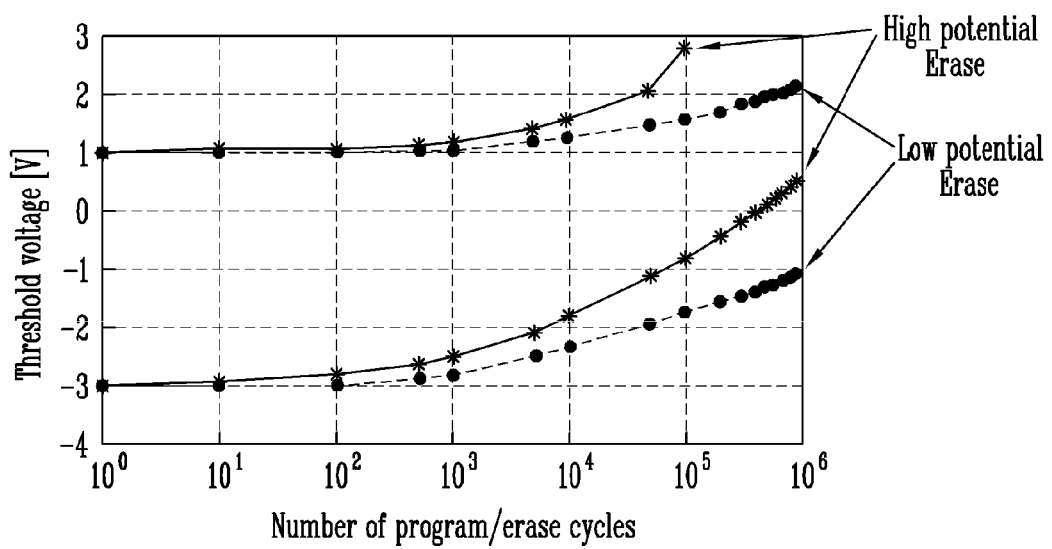
FIG. 3 is a characteristic graph illustrating a slow erase characteristic and a fast program characteristic according to the levels of an erase voltage in a known art.

Referring to FIG. 12, in a first erase operation, the voltage difference between the word line and the bulk is maintained to such an extent that the first erase operation can be normally performed. If the first erase operation is not normally performed, a second erase operation is performed again by gradually increasing the voltage difference. Accordingly, although several hundreds of thousands of the erase operations are performed, the fast program phenomenon and the slow erase phenomenon are generated within approximately 0.5 V. It can be seen that the fast program phenomenon or the slow erase phenomenon is rarely generated in the present disclosure, as compared with the known case where the fast program phenomenon and the slow erase phenomenon are generated at 2 V or higher in FIG. 2.

The embodiments of this disclosure can have the following advantages.

First, when an erase operation is performed, not 0 V, but voltage higher than 0 V is supplied to the global word line. Accordingly, the generation of the leakage current can be prevented in a switching element coupled between the global word line and the local word line. Consequently, voltage flowing into the word line of an unselected block on which an erase operation has not been normally performed can be prevented from decreasing, thereby preventing the generation of a slow erase phenomenon in the unselected block.

Second, in a known operation of verifying whether an erase operation has been normally performed after the erase operation, if there is a memory cell on which the erase operation has not been normally performed, a corresponding block is treated as an invalid block and not used, thereby reducing the data storage capacity. In this disclosure, however, if there is a memory cell on which the erase operation has not been normally performed, the erase operation is performed again by increasing the voltage difference between the word line and the bulk. Accordingly, the generation of an invalid block can be minimized, and thus a reduction in the data storage capacity can be minimized.

Third, if an erase operation is initially performed in the state in which the voltage difference between the word line and the bulk is high, the electrical properties of a memory cell may be deteriorated because electrons are trapped in the tunnel oxide layer or stress is applied thereto. In the present disclosure, however, an erase operation is performed using a minimum voltage difference for the erase operation. If there is a memory cell on which the erase operation has not been normally performed, the erase operation is performed again using a raised voltage difference. Accordingly, the amount of electrons trapped in the tunnel oxide layer or stress applied thereto can be minimized, thereby increasing the lifespan of the memory cell.

Fourth, in the present disclosure, an initial erase operation is performed using a minimum voltage difference. If there is a memory cell on which the erase operation has not been normally performed, the erase operation is performed again using an increased voltage difference. Although several hundreds of thousands of read and erase operations are performed, the generation of a fast program or slow erase phenomenon can be prevented or minimized.

Consequently, reliability of an erase operation can be improved, the generation of failure can be minimized, and the lifespan of a device can be increased.

What is claimed is:

1. A nonvolatile memory device, comprising:
memory cell blocks each configured to include memory cells to be erased by an erase voltage supplied to a word line and a bulk voltage supplied to a bulk;
a bias voltage generator configured to supply the erase voltage to the word line in order to perform an erase operation of the memory cells; and
a bulk voltage generator configured to supply the bulk voltage to the bulk in order to perform the erase operation of the memory cells,
wherein if the unerased memory cell is detected after the erase operation, the bias voltage generator and the bulk voltage generator increase a difference between the erase voltage and the bulk voltage and decrease a time taken for the erase voltage to be supplied to the word lines or a time taken for the bulk voltage to be supplied to the bulk when an additional erase operation is performed.

2. The nonvolatile memory device of claim 1, wherein the bias voltage generator decreases a level of the erase voltage in order to increase the difference between the erase voltage and the bulk voltage when the additional erase operation is performed.

3. The nonvolatile memory device of claim 1, wherein the bulk voltage generator raises a level of the bulk voltage in order to increase the difference between the erase voltage and the bulk voltage when the additional erase operation is performed.

4. The nonvolatile memory device of claim 1, wherein the bias voltage generator narrows a pulse width of the erase voltage in order to reduce a time taken for the erase voltage to be supplied to the word lines when the additional erase operation is performed.

5. The nonvolatile memory device of claim 1, wherein the bulk voltage generator narrows a pulse width of the bulk voltage in order to reduce a time taken for the bulk voltage to be supplied to the bulk when the additional erase operation is performed.

* * * * *